US012663463B2

(12) United States Patent　　　　(10) Patent No.:　US 12,663,463 B2
Knierim et al.　　　　　　　　　　　(45) Date of Patent:　　Jun. 23, 2026

(54) SPLIT-PATH MULTIPLEXING ACCESSORY FOR A TEST AND MEASUREMENT INSTRUMENT

(71) Applicant: Tektronix, Inc., Beaverton, OR (US)

(72) Inventors: Daniel G. Knierim, Beaverton, OR (US); Joshua J. O'Brien, Aloha, OR (US)

(73) Assignee: Tektronix, Inc., Beaverton, OR (US)

( * ) Notice: Subject to any disclaimer, the term of this patent is extended or adjusted under 35 U.S.C. 154(b) by 293 days.

(21) Appl. No.: 18/510,644

(22) Filed: Nov. 16, 2023

(65) Prior Publication Data

US 2024/0159824 A1　　May 16, 2024

Related U.S. Application Data

(60) Provisional application No. 63/425,997, filed on Nov. 16, 2022, provisional application No. 63/426,001, filed on Nov. 16, 2022.

(51) Int. Cl.
*G01R 31/28*　　　　(2006.01)

(52) U.S. Cl.
CPC ................................. *G01R 31/2884* (2013.01)

(58) Field of Classification Search
CPC ............ G01R 31/2884; G01R 13/0236; G01R 13/28
USPC ..................................... 324/762.01, 537, 500
See application file for complete search history.

(56) References Cited

U.S. PATENT DOCUMENTS

| | | | |
|---|---|---|---|
| 5,418,470 A | 5/1995 | Dagostino et al. | |
| 6,532,557 B1 | 3/2003 | Wong et al. | |
| 6,703,825 B1 | 3/2004 | Creek et al. | |
| 7,656,909 B1 | 2/2010 | Sternowski | |
| 8,583,390 B2 | 11/2013 | Pupalaikis et al. | |
| 8,868,021 B1 | 10/2014 | Feldman | |
| 8,971,874 B2 | 3/2015 | Han et al. | |
| 9,210,598 B1 | 12/2015 | Bradley | |
| 9,325,435 B2 | 4/2016 | Olgaard et al. | |
| 9,838,046 B2 | 12/2017 | Lum et al. | |
| 9,863,988 B1 | 1/2018 | Seguine | |

(Continued)

OTHER PUBLICATIONS

Korean Intellectual Property Office, International Search Report and Written Opinion for International Application No. PCT/US2023/079979, Mar. 20, 2024, 11 pages, Daejeon, Republic of Korea.

(Continued)

*Primary Examiner* — Giovanni Astacio-Oquendo

(74) *Attorney, Agent, or Firm* — Miller Nash LLP; Andrew J. Harrington

(57)　　　　ABSTRACT

An input selector for electrically connecting one of a plurality of test signals from one or more devices under test to a test and measurement instrument, the input selector includes a first multiplexer having a first set of multiple inputs, each of the first set of multiple inputs coupled to a different one of the plurality of test signals from one or more devices under test, and having a first output of a selected one of the first multiple inputs, and a second multiplexer having a second set of multiple inputs, each of the second set of multiple inputs coupled to a different one of the plurality of test signals from the one or more devices under test, and having a second output of a selected one of the multiple inputs. Methods are also described.

22 Claims, 6 Drawing Sheets

(56) References Cited

U.S. PATENT DOCUMENTS

| | | | |
|---|---|---|---|
| 10,158,553 | B2 | 12/2018 | Tiwari et al. |
| 10,432,434 | B2 | 10/2019 | Pickerd et al. |
| 10,476,740 | B1 * | 11/2019 | Cote ....................... G06F 30/33 |
| 11,233,585 | B2 | 1/2022 | Horsfield et al. |
| 11,693,046 | B2 * | 7/2023 | Li ..................... G01R 31/2841 |
| | | | 702/67 |
| 12,298,329 | B2 * | 5/2025 | Zivny ................ G01R 13/0254 |
| 12,510,584 | B2 * | 12/2025 | Kwon ................ G01R 31/2834 |
| 2003/0071606 | A1 | 4/2003 | Sunter |
| 2006/0252419 | A1 | 11/2006 | Liu |
| 2009/0134893 | A1 | 5/2009 | Frame et al. |
| 2010/0220874 | A1 | 9/2010 | Sakai et al. |
| 2012/0007605 | A1 | 1/2012 | Benedikt |
| 2014/0087668 | A1 | 3/2014 | Mow et al. |
| 2018/0026816 | A1 | 1/2018 | Pickerd et al. |
| 2021/0067147 | A1 * | 3/2021 | Sobolewski ....... G01R 31/2621 |
| 2021/0270699 | A1 | 9/2021 | Piazza et al. |
| 2022/0034967 | A1 | 2/2022 | Strickling et al. |
| 2022/0082609 | A1 * | 3/2022 | Hong .............. G01R 31/31905 |
| 2022/0390513 | A1 | 12/2022 | Hazzard et al. |

OTHER PUBLICATIONS

Korean Intellectual Property Office, International Search Report and Written Opinion for International Application PCT/US2022/032264, Oct. 4, 2022, 11 pages, Daejeon, Republic of Korea.
Tektronix, Inc., TriMode Probe Family: P7500 Series Datasheet, 11 pages, Web Page <https://www.tek.com/en/datasheet/trimode(tm)-probe-family-0>, retrieved electronically on Jun. 7, 2002.

* cited by examiner

SPLIT-PATH MULTIPLEXING ACCESSORY FOR A TEST AND MEASUREMENT INSTRUMENT

REFERENCE TO RELATED APPLICATIONS

This disclosure is a non-provisional of and claims benefit from U.S. Provisional Application No. 63/425,997, titled "SPLIT-PATH ANALOG MUX ACCESSORY FOR A TEST AND MEASUREMENT INSTRUMENT," filed on Nov. 16, 2022, and from U.S. Provisional Application No. 63/426,001, titled "SPLIT-PATH HIGH-DENSITY ANALOG MUX ACCESSORY FOR A TEST AND MEASUREMENT INSTRUMENT," filed on Nov. 16, 2022, the disclosures of both of which are incorporated herein by reference in their entirety. This application is also related to U.S. patent application Ser. No. 17/832,535, titled "MULTI-INPUT REMOTE HEADS FOR SEQUENTIAL TESTING", filed on Jun. 3, 2022, which is also incorporated by reference herein.

TECHNICAL FIELD

This disclosure is directed generally to systems and methods related to test and measurement systems, and, in particular, to a multiplexing accessory for switching between multiple signals from one or more devices under test (DUT).

BACKGROUND OF THE INVENTION

Many DUTs include a multitude of similarly designed signal paths. For example, a Peripheral Component Interconnect (PCI) Express (PCIe or PCI-e) plug-in card and/or a PCIe motherboard slot commonly include up to sixteen electrical signal "lanes." The electrical signal lanes are typically differential signal lanes, meaning that one differential lane requires two electrical measurement ports to fully measure the differential signal of the lane. Thus, to fully measure a sixteen lane PCIe device would require 32 electrical measurement ports. However, test and measurement instruments typically used to test such DUTs, such as oscilloscopes or bit error rate testers (BERTs), typically have one, two, or four input ports. Although some oscilloscopes include eight input channels or ports, high performance instruments typically have fewer input channels due to the increased hardware costs associated with each channel. Physical channel density limitations also can keep channel count low for thermal and throughput reasons. For this reason, it is typical that a test and measurement instrument configuration will be connected to only a subset of the electrical signal lanes to be tested.

Since only a subset of lanes are coupled to the test and measurement instrument, if a user wishes to test all of the signal lanes, the user must manually move a connection between the test and measurement instrument and the DUT, e.g., a test cable or probe, from each lane to the next lane. Manually moving the cable or probe is an error-prone and very time and labor-intensive process. Alternatively, such as in a two-channel test and measurement environment, a radio frequency (RF) switch can be built and maintained to allow for automation for testing all signal lanes of the DUT. However, identifying a suitable switch and correctly de-embedding the impact of the switch from the signal path, which is performed manually, are difficult at higher frequencies. Because of these reasons, many users do not trust the switches can be de-embedded without significant errors, especially above 25 GHz. De-embedding or "calibrating" for the impact of the switch, or other component, on a signal path is the compensation for negative effects the switch has on signals propagating through the signal path. In addition to the need for de-embedding, an RF switch matrix is physically large, which makes the RF switch matrix solution particularly unattractive to users having limited physical area for testing.

Electro-mechanical switch solutions suffer from an additional problem in that they generally leave unselected inputs as an open circuit, i.e., are generally not terminated, which may affect the signal integrity of the DUT.

Examples of the disclosure address these and other deficiencies of the prior art.

BRIEF DESCRIPTION OF THE DRAWINGS

Aspects, features and advantages of examples of the present disclosure will become apparent from the following description of examples in reference to the appended drawings in which.

DESCRIPTION

Embodiments of the present disclosure utilize a split-path multiplexing component to enable switching between multiple DUT signals and a test and measurement instrument. In a split-path multiplexing system, a high frequency portion of the signal being tested is separated from a low frequency portion, and then the two portions are switched through separate signal paths. Advantageously, the high-frequency path may be switched through solid-state RF switches, which are much smaller, less expensive, and more reliable than electro-mechanical switches. The solid-state switches may be PIN diode switches, for example. In some embodiments a diplexer is used to separate the frequencies. In some embodiments, a second diplexer is used to re-join the separated frequency divisions before sending the resultant signal to the test and measurement instrument, although there are many variations, as described below.

In embodiments of the present disclosure, the distant or remote locations of the split-path switching system means that test and measurement systems do not need to occupy significant space on benchtop on which the test and measurement system is located in an attempt to position an input of the system as close as possible to a test point of a DUT.

Figure 1:
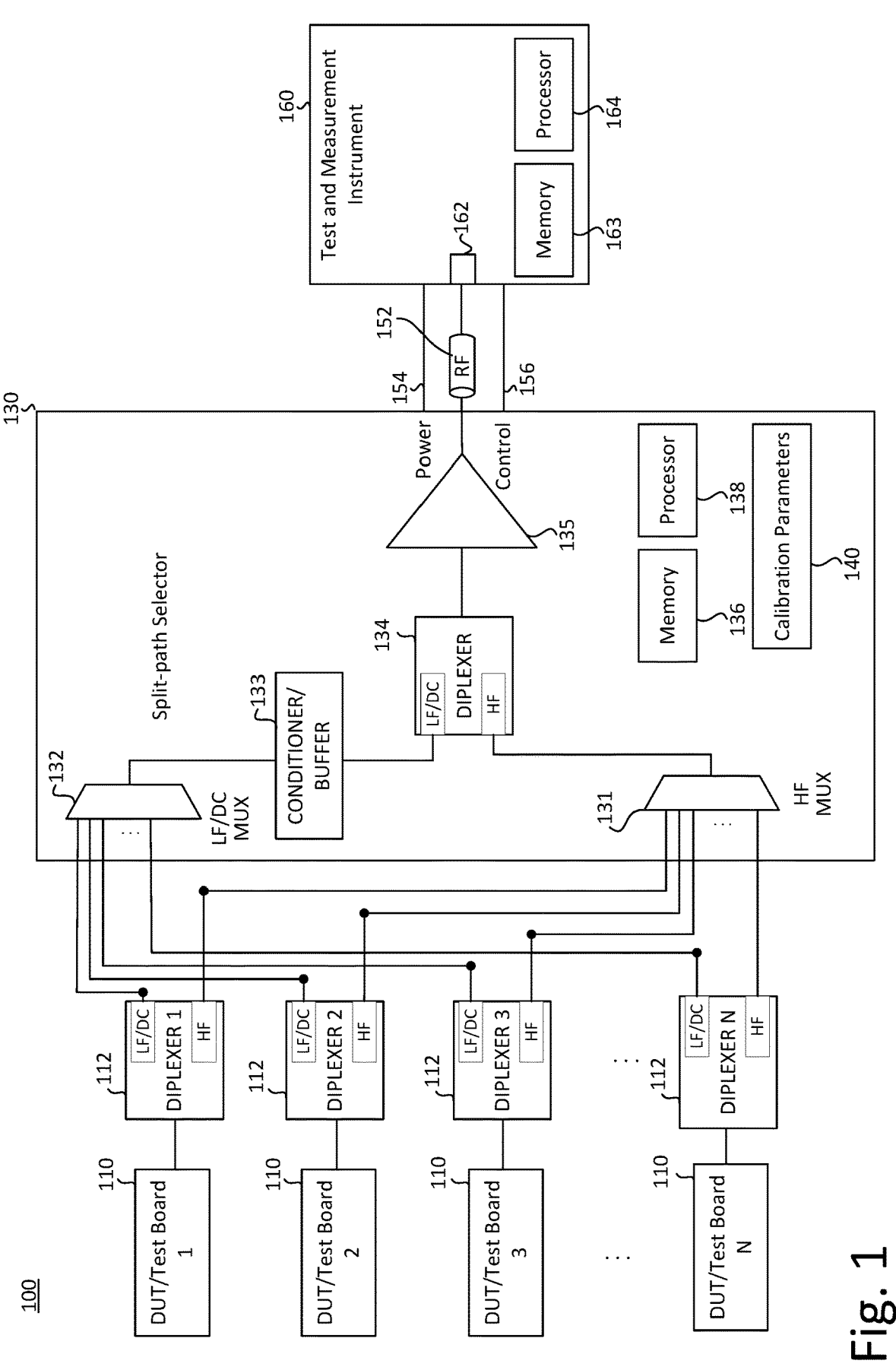
FIG. 1 is a block diagram of a test and measurement system including a split-path selector in which the lower frequencies or DC signals and the higher frequencies are independently selected, according to some embodiments of the present disclosure.

FIG. 1 is a block diagram of a test and measurement system 100 including a split-path selector 130 coupled between multiple test boards or DUTs 110 available for testing, and a test and measurement instrument 160, according to some examples of the present disclosure. For convenience, in this disclosure, the signals for testing are described as originating in a DUT 110, although the signals may originate in test boards, or from other sources. In this example embodiment there are four DUTs 110, labeled DUT 1, DUT 2, DUT 3, and DUT N, which indicates that the split-path selector 130 may choose between a large number of different signals for testing, and is not limited to four. In some embodiments the split-path selector 130 may include 8, 16, or 32 switches, as described in further detail below.

In FIG. 1, a diplexer 112 is coupled between each DUT 110 and the split-path selector 130. In this embodiment, each DUT 110 includes a separate diplexer 112, but such a correspondence is not necessary in all embodiments. The function of the diplexer 112 is to split a signal, such as a signal that may be measured by the test and measurement instrument 160 into to component parts—a low frequency, and/or Direct Current (DC) portion, sometimes abbreviated LF/DC and a high frequency portion (HF). Depending on the architecture, a diplexer 112 includes an electric network made up of any or all of capacitors, resistors, and inductors, and are well known. Diplexers 112 may be selected based on their splitting frequency and other performance characteristics. In other words, the frequency that differentiates LF/DC signals from HF signals may vary depending on the particular diplexer 112 chosen. In one example, in the system of FIG. 1, the diplexer 112 may split its input signal at about 10 kHz, so that frequencies in the original signal at or below 10 kHz are routed to an LF/DC output of the diplexer 112, while frequencies in the original signal above 10 kHz are routed to an HF output of the diplexer. Another diplexer 112 could use 1 MHz as the splitting, or cross-over frequency. The splitting frequency of the diplexers 112 according to embodiments may be implementation specific.

In the embodiment illustrated in FIG. 1, the HF outputs of the diplexers 112 are fed to an HF multiplexer 131, while the LF/DC outputs of the diplexers are fed to an LF/DC multiplexer 132. Each of the multiplexers 131, 132 are part of the split path selector 130, which has an overall function of selecting which of the DUTs 110 is coupled to the test and measurement instrument 160. More specifically, the split path selector 130 determines which test signal, which originates from the DUT 110 (and also may be a test board or other signal source) is selected to be coupled to the test and measurement instrument 160.

As described above, the HF multiplexer 131 may be formed of solid-state RF switches, such as PIN-diode switches, which are very small, especially compared to the full-frequency band RF matrix of switches described above. The HF multiplexer 131 may also be formed of Micro Electro-Mechanical Switches (MEMS), which are likewise very small, and have good RF performance. By virtue of being made from physically small switches and other components, it is much easier to integrate the split path selector 130 on a test bench or in a testing setup compared to prior devices. Also, as described below, after the desired signal has been selected through the multiplexers 131, 132, the signal may be conditioned, such as amplified, or other modifications made to it prior to sending the signal to the test and measurement instrument 160. Also, the solid-state RF switches making up the multiplexer 131 may be non-reflective, i.e., are properly terminated so that all of the signals from the DUTs not selected to send to the test and measurement instrument 160 do not cause reflections back to the respective devices, or elsewhere in the testing system, which could negatively affect measurements. The solid-state RF switches used to make up the HF multiplexer 131 generally do not operate at sufficiently low frequencies, however, which is one of the reasons why the diplexer 112 is in place—to remove the low frequencies from the signal being tested from the selected DUT 110 before it is routed to the HF multiplexer 131.

The LF/DC multiplexer 132 may also include a solid-state switch network, although the switches making up the LF/DC multiplexer 132 may be different from those making up the HF multiplexer 131. For example, the LF/DC multiplexer 132 may be made of Field Effect Transistor (FET) switches or MEMS switches.

Electrical connections connecting the HF outputs of the diplexer 112 to the HF multiplexer 131 may be in the form of ribbon bands or coaxial cable, depending on the implementation. In general, due to the differences in the frequencies of the signals, the LF/DC outputs of the diplexer 112 may be coupled to the LF/DC multiplexer 132 by simple wires.

In operation, the LF/DC multiplexer 132 and the HF multiplexer 131 are operated in concert to choose a single input source to present to the test and measurement instrument 160. For example, when it is desired to select a test signal from the DUT 1, 110, both the LF/DC multiplexer 132 and the HF multiplexer 131 are controlled to select the DUT 1, 110. Then, following the signal from the DUT 1, 110, the signal to be tested is first split by the diplexer 1, 112 into a LF/DC portion and a HF portion, which are separately routed to multiplexer 132 and the HF multiplexer 131 as illustrated in FIG. 1. Then, since the LF/DC multiplexer 132 and the HF multiplexer 131 are operated to select the signals originating from the DUT 1, 110, those signals are output from the LF/DC multiplexer 132 and the HF multiplexer 131. Next, the selected LF/DC signal from DUT 1 110 may be conditioned, or buffered, in a signal conditioner 133, the function of which is described below. Next the conditioned LF/DC signal from the signal conditioner 133 is presented to an LF/DC input of a diplexer 134 and the HF signal output from the HF multiplexer 131 is presented to an HF input of the diplexer 134. Diplexers are bi-directional, in that, when connected to a single signal source, a diplexer splits the signal into LF/DC components and HF components as described above. When instead a diplexer is connected to two signal sources, one having LF/DC components and another having HF components, the diplexer combines the signals to a unified, broad-spectrum signal that has both the LF/DC components and the HF components. Therefore, the output of the diplexer 134 is the signal to be measured by the test and measurement instrument 160. As described below, the output of the diplexer 134 may be modified and/or amplified, such as through an amplifier 135, prior to being sent to a test port 162 of the test and measurement instrument 160 through an RF connection, such as a cable 152.

The split-path selector 130 may receive power from the measurement instrument 160 over a power line 154 to power the multiplexers 131, 132, amplifier 135, and potentially other components of the split-path selector. In other embodiments the split-path selector 130 may be coupled to a power supply separate from the measurement instrument 160, such as one directly plugged into wall power. In yet other embodiments the split-path selector 130 may be able to draw power from the DUT 110 without affecting the integrity of the signals of the DUT for testing. For example, a Universal Serial Bus transmits power as well as data over its lines and the split-path selector 130 may be able to use a small amount of power from the USB cables. In yet other embodiments, the power needs of the split-path selector 130 may be so small that they can be met by a battery, either rechargeable or replaceable, contained within the split-path selector 130. This may be possible with certain embodiments of the split-path selector 130, such as when the split-path selector 130 is embodied as an Application Specific Integrated Circuit (ASIC) or a Micro-Electromechanical System (MEMS) switch. In other embodiments the split-path selector 130 may include multiple discrete components mounted to a Printed Circuit (PC) board.

As described below, control signals between the measurement instrument 160 and split-path selector 130 may be carried on a control line 156. In some embodiments a user or operator may operate the measurement instrument 160 to select signals from the DUT 110 for testing. In response, the measurement instrument 160 sends a control signal across the control line 156 to cause the split-path selector 130 to operate the HF multiplexer 131 and the LF/DC multiplexer 132 to select the desired signal, which is then combined in the diplexer 134 and amplified by the amplifier 135 prior to being sent to the measurement instrument 160 for testing. The user may make the selection on a user interface of the measurement instrument 160, or may instruct the instrument using programmatic controls, such as using the PI programming interface available on measurement instruments from Tektronix, Inc. of Beaverton, Oregon. By using programmatic controls, signals from any of the desired DUTs 110 may be scripted to be tested in sequence without any necessity of the user to physically change any cables between the DUT 110 and the measurement instrument 160. Instead, the switching to connect the desired signal of the DUT 110 to the measurement instrument 160 is performed by controlling the multiplexers 131, 132 of the split-path selector 130.

In FIG. 1, the connection to the test port 162, power line 154 and control line 156 may be included in a probe interface to the measurement instrument 160. Also, in some embodiments, the power line 154 and control line 156 may be embodied in a single connection, i.e., one that sends both power and control signals over the same line.

In some examples, the split-path selector 130 may include a memory 136 and/or a controller or processor 138. The split-path selector 130 may be tested during manufacturing or at the factory to measure the effects of including the split-path selector 130 in the testing system 100 compared to connecting a particular output of the DUT 110 directly to the test port 162 of the measurement instrument 160. Compensating for any negative effects of including the split-path selector 130, its components including the multiplexers 131, 132 and amplifier 135, and its related cables is referred to as de-embedding or calibrating. The term calibration parameters in this disclosure refers to any calibration parameter, including de-embed parameters of the split-path selector 130, that are used to remove effects or impacts of the presence of the split-path selector 130 and its related cables in the testing system 100 from any signal measurements made by the test and measurement instrument 160. The calibration parameters may be stored in a particularized calibration parameters memory 140 or in the general memory 136 and sent to the test and measurement instrument 160 during a testing session. In some examples, the calibration parameters may be sent to an analysis device that is remote from the test and measurement instrument 160. The analysis device may collect the calibration parameters as well as data from the test and measurement instrument 160 and provide any processing needed of the data, as will be understood by one skilled in the art. In other examples, the calibration parameters for a particular split-path selector 130 may be stored in a memory 163 located in the test and measurement instrument 160 or retrieved from remote storage, such as cloud storage and sent to the split-path selector 130 to be stored in its calibration parameters storage 140. The particular calibration parameters used to de-embed the effects of the split-path selector 130 may be identified based on a serial number or other identification number of the split-path selector 130, for example.

Scattering parameters, also referred to as S-parameters, for each of the ports of the multiplexers 131, 132 may be stored along with the calibration parameters 140 or in the separate memory 136 to assist the test and measurement instrument 160 in de-embedding the split-path selector 130 from the signal of the DUT 110. The through path and isolation path S-parameters are stored for each of the connectors of the multiplexers 131, 132 as well as the port 162 of the measurement instrument 160. In some examples, a user may upload or otherwise port their own S-parameters, such as if the user wishes to change the S-parameters or add stress to the system.

Amplifier 135 may be an active amplifier having a low impedance input, such as 50 Ohms, which is compatible for testing many serial data DUTs 110, such as PCIe devices, Serial ATA (AT Attachment) busses, Mobile Industry Processor Interface (MIPI) interfaces, Fibre Channel, and High-Definition Multimedia Interface (HDMI) interfaces, for example. In other embodiments the amplifier 135 may include or use a buffer to buffer signals from the DUT 110 for testing. In these embodiments the amplifier 135 typically has a relatively high input impedance, such as 100 kOhm or 150 kOhm DC input resistance. In another example the amplifier 135 may have 1 MOhm impedance. A split-path selector 130 having this relatively high input impedance is useful for testing memory circuits, as well as high speed serial busses, for example. In either the case of a low impedance input amplifier 135 or a high impedance input amplifier 135, including the amplifier 135 in the split-path selector allows the selected signal from the output of the multiplexers 131, 132 to be amplified as close to the selected source as possible and in a manner that maximizes its signal transfer characteristics to the measurement instrument 160. Not only does this placement of the amplifier 135 within the split-path selector 130 decrease noise interference, the use of the calibration parameters 140 within the split-path selector 130 allows a calibration plane to be closer to a desired test plane of the DUT 110.

In some examples, such as the one illustrated in FIG. 1, the split-path selector 130 may include a processor 138. The processor 138 can operate the multiplexers 131, 132 to connect the selected DUT 110 to the test and measurement instrument 160. In other examples, a processor 164 of the test and measurement instrument 160 can send control signals to the multiplexers 131, 132 or to the processor 138 of the split-path selector 130 to connect the selected DUT 110 to the test and measurement instrument 160.

As described above, the path out of the LF/DC multiplexer 132 may include a signal conditioner 133 before the output is sent to the diplexer 134 for recombination. The signal conditioner 133 may modify the signal after leaving the LF/DC multiplexer 132 to compensate for differences in the separate LF/DC and HF signals after being split by the diplexer 112. For example, the signal conditioner 133 may introduce a delay into the LF/DC signal so that it combines with the HF signal from the HF multiplexer 131 to be a more accurate representation of the original signal sourced from the DUT 110 prior to splitting. In some cases, the signal conditioner 133 may be programmable to introduce different compensation based on which signal is output from the LF/DC multiplexer 132. For example, the user may be able to adjust the delay provided by the signal conditioner 133 based on the type of signal from the DUT 110, which may be different based on the particular DUT 110 chosen for testing. Further signal compensation may be introduced by the signal conditioner 133 to compensate for the effects of the diplexer 112 on the different LF/DC and HF signals, and for the different effects from the different multiplexers 131, 132. In some cases, little or no conditioning may be needed, but in other cases, significant conditioning may be performed by the signal conditioner 133. In some embodiments the signal conditioner 133 may modify the amplitude of the LF/DC signal before recombining into the diplexer 134, such as by amplifying or attenuating the LF/DC signal received from the multiplexer 132. In other embodiments the signal conditioner 133 may modify the LF/DC output of the selected DUT 110 by partially or completely removing a DC signal normally present on the output of the DUT 110. For example, if the DUT 110 typically generates an AC signal carried on a 1 Volt DC offset voltage, the signal conditioner 133 may be operated to remove any or all of the 1 Volt DC carrier voltage prior to combining the remaining LF portions of the signal with the HF portions of the signal in the diplexer 134. When the full DC portion of the signal is removed as described above, then only the AC signal from the DUT 110 is presented to the test and measurement instrument 160, which is the desired signal for analysis.

Another function of the signal conditioner 133 is that it can be used to provide a voltage termination for the LF/DC signal from the LF multiplexer 132 to a voltage other than ground. For instance, when terminating an LF/DC signal from an HDMI signal, the signal conditioner 133 may terminate the signal into 3.3 Volts, rather than terminating it into a ground reference. The signal conditioner 133 may be operated to provide any necessary terminating voltage.

Figure 2:
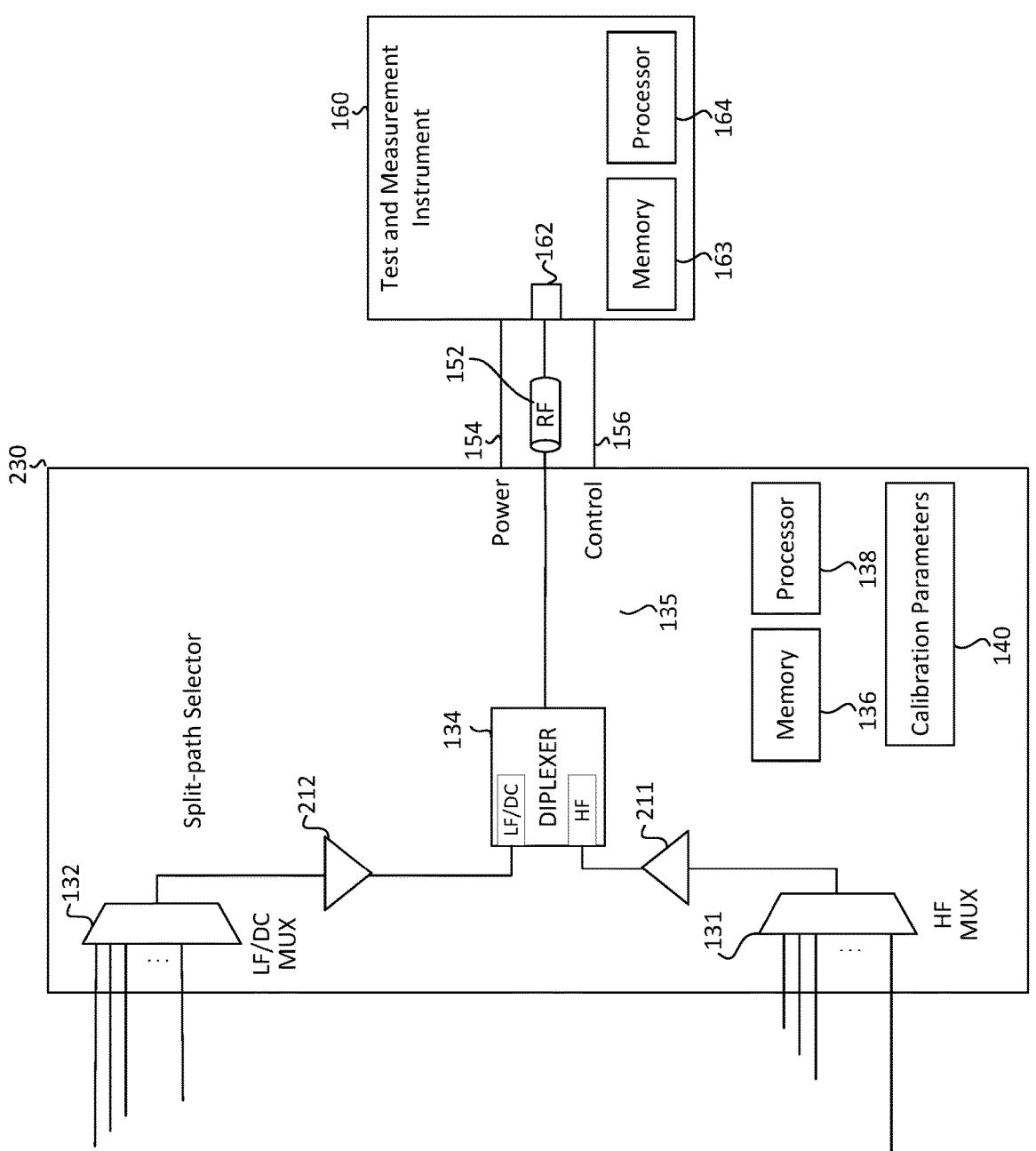
FIG. 2 is a block diagram of a test and measurement system including a split-path selector in which the lower frequencies or DC signals and the higher frequencies are independently selected, and then may be independently amplified, according to some examples of the present disclosure.

FIG. 2 is a block diagram of a test and measurement system 200 including a split-path selector 230 in which the lower frequencies or DC signals and the higher frequencies are independently selected, and then may be independently amplified, according to some examples of the present disclosure. In FIG. 2, the DUT test boards 110 and diplexers 112 as well as routing circuits have been omitted for clarity. It can be assumed that the split-path selector 230 can be coupled to those elements from FIG. 1, or other devices having signals to be measured. Also, description of the commonly numbered elements from FIG. 1 is omitted for brevity.

Differently than in FIG. 1, the split-path selector 230 includes a LF/DC amplifier 212 coupled between the output of the LF/DC multiplexer 132 and the diplexer 134, and an HF amplifier 211 coupled between the output of the HF multiplexer 131 and the diplexer 134. In this embodiment, each of the HF portion of the signal being tested and the LF/DC portion of the signal being tested may be independently amplified or modified. Although the components 211, 212 are illustrated as amplifiers, they may contain additional components for conditioning the signal such as those described above with reference to the signal conditioner 133 of FIG. 1.

Figure 3:
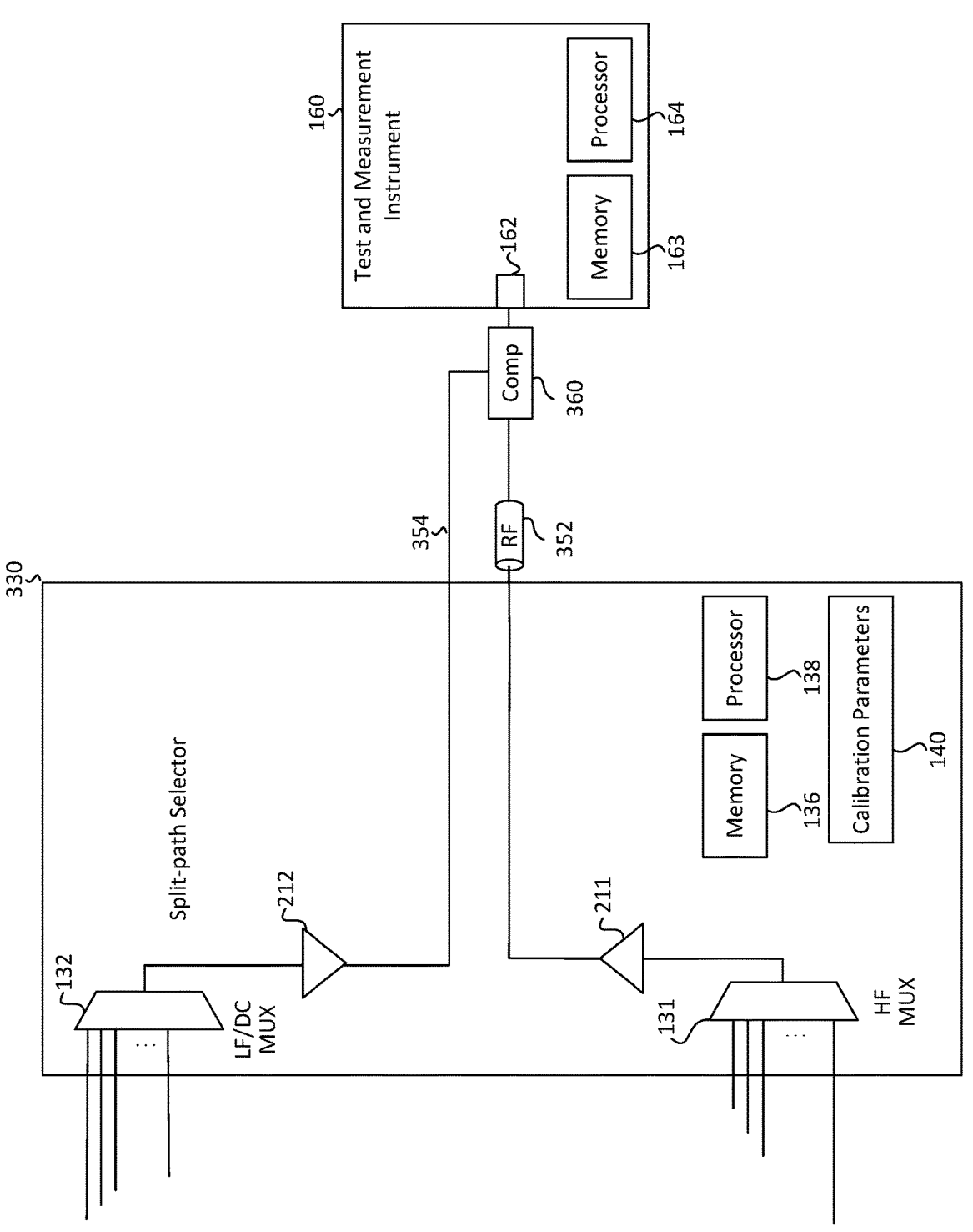
FIG. 3 is a block diagram of a test and measurement system including a split-path selector in which the lower frequencies or DC signals and the higher frequencies are independently selected, and then separately sent to a test and measurement device for recombination, according to some embodiments of the present disclosure.

FIG. 3 is a block diagram of a test and measurement system 300 including a split-path selector 330 in which the lower frequencies or DC signals and the higher frequencies are independently selected, through the multiplexers 131, 132, as described above, and then separately sent to a test and measurement device for recombination, according to some embodiments of the present disclosure.

The split-path selector 330 differs from those of FIGS. 1 and 2 in that the LF/DC portion of the selected signal from the multiplexer 132 and the HF portion of the selected signal from the multiplexer 131 are not recombined in the selector 330. Instead, these LF/DC and HF component portions are sent to the test and measurement instrument separately. In one embodiment, the LF/DC and HF component portions are sent to a compensation box 360, which is coupled to the test and measurement instrument 160. Specifically, the LF/DC portion is coupled to the compensation box 360 through a wire 354, which may be much smaller than an RF cable 352 used to carry the HF portion. The compensation box 360 includes a diplexer (not illustrated) to combine the LF/DC and HF components back into the full signal that was selected from the particular DUT 110 (FIG. 1) for measurement by the test and measurement instrument 160.

Amplifiers 211, 212 may modify the LF/DC and HF portions of the selected signal independently, as described above with reference to FIG. 2.

Figure 4:
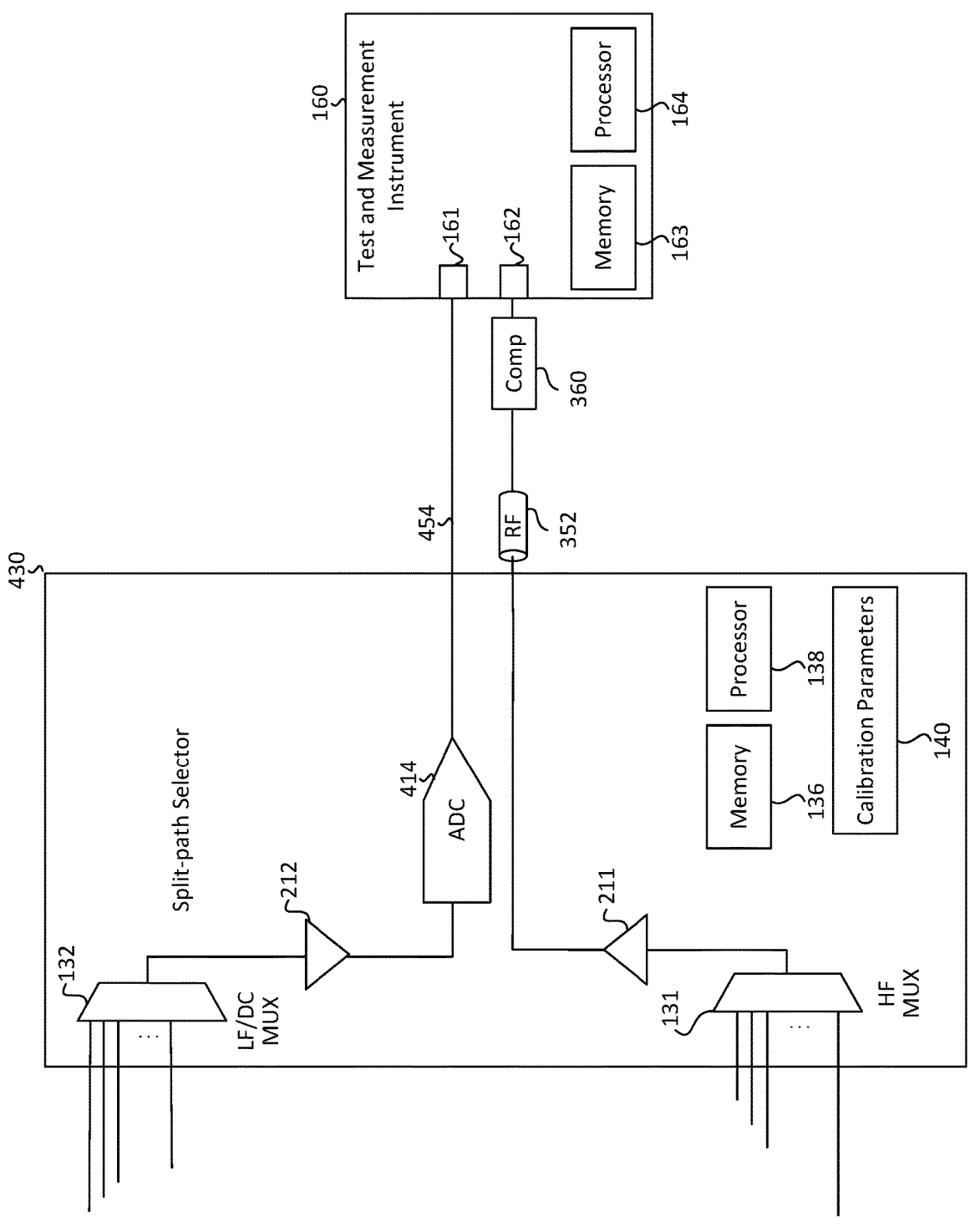
FIG. 4 is a block diagram of a test and measurement system including a split-path selector in which the lower frequencies or DC signals and the higher frequencies are independently selected, and the lower frequencies or DC signals are converted to a digital signal by an analog-to-digital converter, according to some embodiments of the present disclosure.

FIG. 4 is a block diagram of a test and measurement system 400 including a split-path selector 430 in which the lower frequencies or DC signals and the higher frequencies are independently selected through the multiplexers 131, 132, as described above. Then, differently than previously described embodiments, the LF/DC portions of the signal selected for testing are converted to a digital signal using an analog to digital converter (ADC) 414. The output of the ADC 414 is a digital signal that represents the LF/DC portions of the signal selected for testing. The output of the ADC 414 may be carried to an input port 161 of the test and measurement instrument 160, while the HF portions of the signal selected for testing are carried by an RF cable 352. Although not illustrated, it is possible to convert the analog signal of the selected signal from the DUT 110 (not illustrated) to a digital signal prior to selecting it by the LF/DC multiplexer 132. In this embodiment, multiple, separate ADCs are used, each between their respective DUT 110 (FIG. 1) and the LF/DC multiplexer 132. Also, in this embodiment, the LF/DC multiplexer 132 is a digital multiplexer rather than an analog multiplexer as described above. In operation, the digital LF/DC multiplexer 132 is operated to choose the selected signal, which is already in digital form. The remaining portions of the split-path selector 430 operate as described above.

In practice, the test and measurement instrument 160 may digitize the HF portions of the signal selected for testing after being received by the input port 162. Then, the test and measurement instrument 160 may combine the digital signals for testing, i.e., the LF/DC digital signal that was digitized by the ADC 414 in the split-path selector 430, and the HF digital signal that was digitized by an ADC (not illustrated) within the test and measurement instrument 160.

Figure 5:
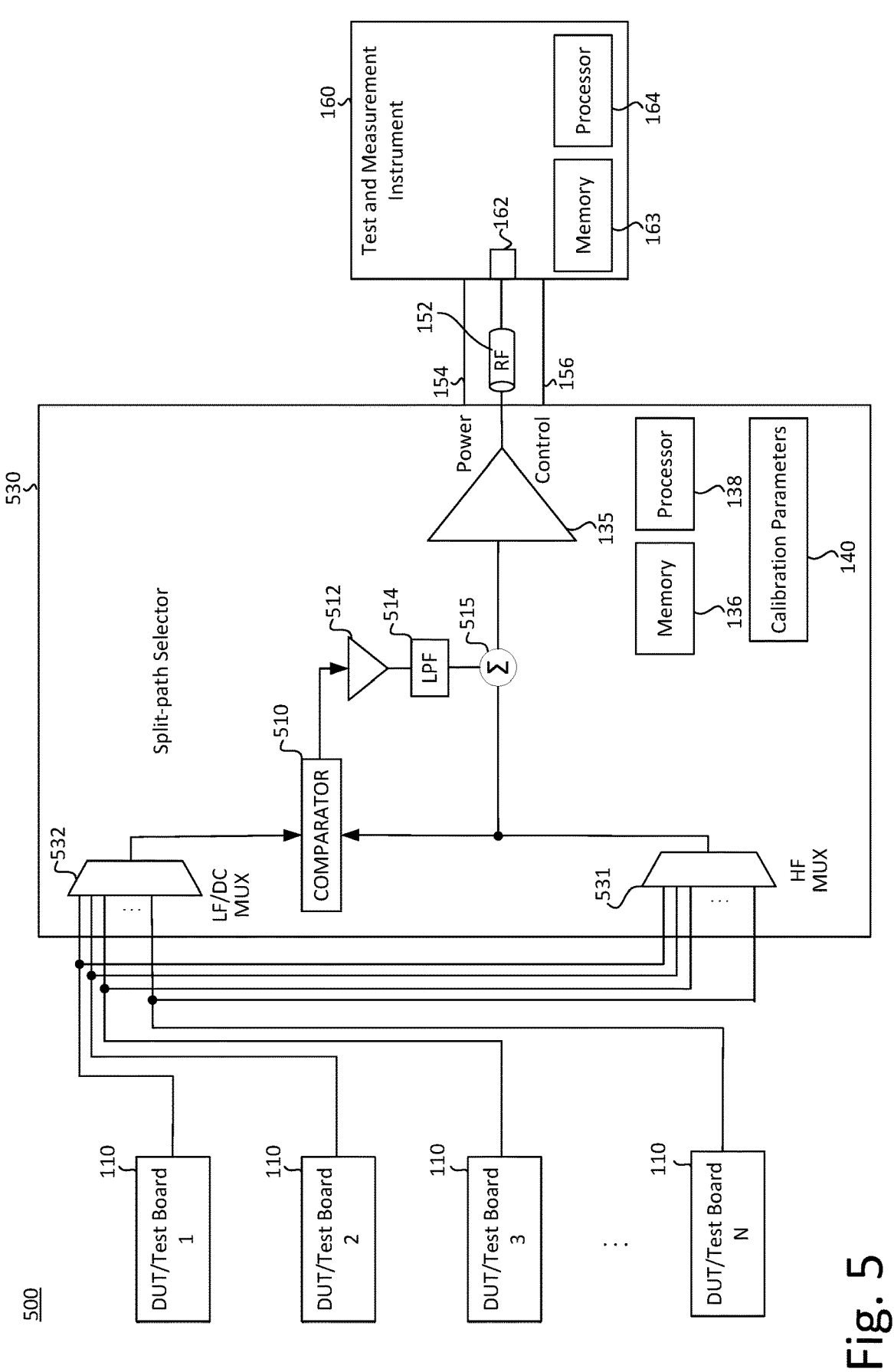
FIG. 5 is a block diagram of a test and measurement system including a split-path selector in which the lower frequencies or DC signals and the higher frequencies are independently selected, and further including a feed-forward control system according to embodiments.

FIG. 5 is a block diagram of a test and measurement system 500 including a split-path selector 530. Similar to the above embodiments, there are two multiplexers 531, 532. But different to the above embodiments, the test signal selected from the DUT 110 is not split into two components, but rather the full test signal is applied to both the multiplexers 531, 532 simultaneously. The multiplexer 531 is an RF multiplexer, while the LF/DC multiplexer 532 may be a simpler multiplexer made from solid state switches that need not have good HF qualities. In practice, the LF/DC multiplexer 532 passes low frequency and/or DC signals, and tends to block high frequency signals, while the HF multiplexer 531 passes high frequency signals and tends to block low frequency signals. Based on the frequencies of the signal selected for measuring, the LF/DC multiplexer 532 may pass more of the selected signal, the HF multiplexer 531 may pass more of the selected signal, or both the multiplexers 531, 532 may pass their respective portions of the selected signal somewhat equally.

A comparator 510 compares the outputs of both the multiplexers 531, 532, and the comparison is used to drive a low frequency operational amplifier 512 to add back the LF/DC component back to the HF signal output of the multiplexer 531. In some embodiments a low pass filter 514 is located between the amplifier 512 and a summer 515. The summer 515 adds the output from the low pass filter 514 to the output of the HF multiplexer 531 prior to the combined signal being presented to the amplifier 135, for further passage to the test and measurement instrument 160, as described above. The low pass filter 514 may include a resistor-capacitor network with a single pole crossover at a frequency that is chosen to be within both the operating bands of the LF/DC multiplexer 532 as well as the HF multiplexer 531. For instance, the frequency of the low pass filter 514 may be selected to be between 1 kHZ and 10 MHz, and more preferably between 10 kHZ and 1 MHz.

In operation, depending on the selected signal, the components of the split-path selector 530 tend to measure the differences between the output of the LF/DC multiplexer 532 as well as the HF multiplexer 531, and then add the difference back to the output of the HF multiplexer 531 through the summer 515. In the configuration of FIG. 5, the comparator 510 is a component of a feed-forward loop, which tends to create the signal for presenting to the amplifier 135 that is a faithful representation of the selected signal for testing, i.e., the signal from the selected DUT 110.

Figure 6:
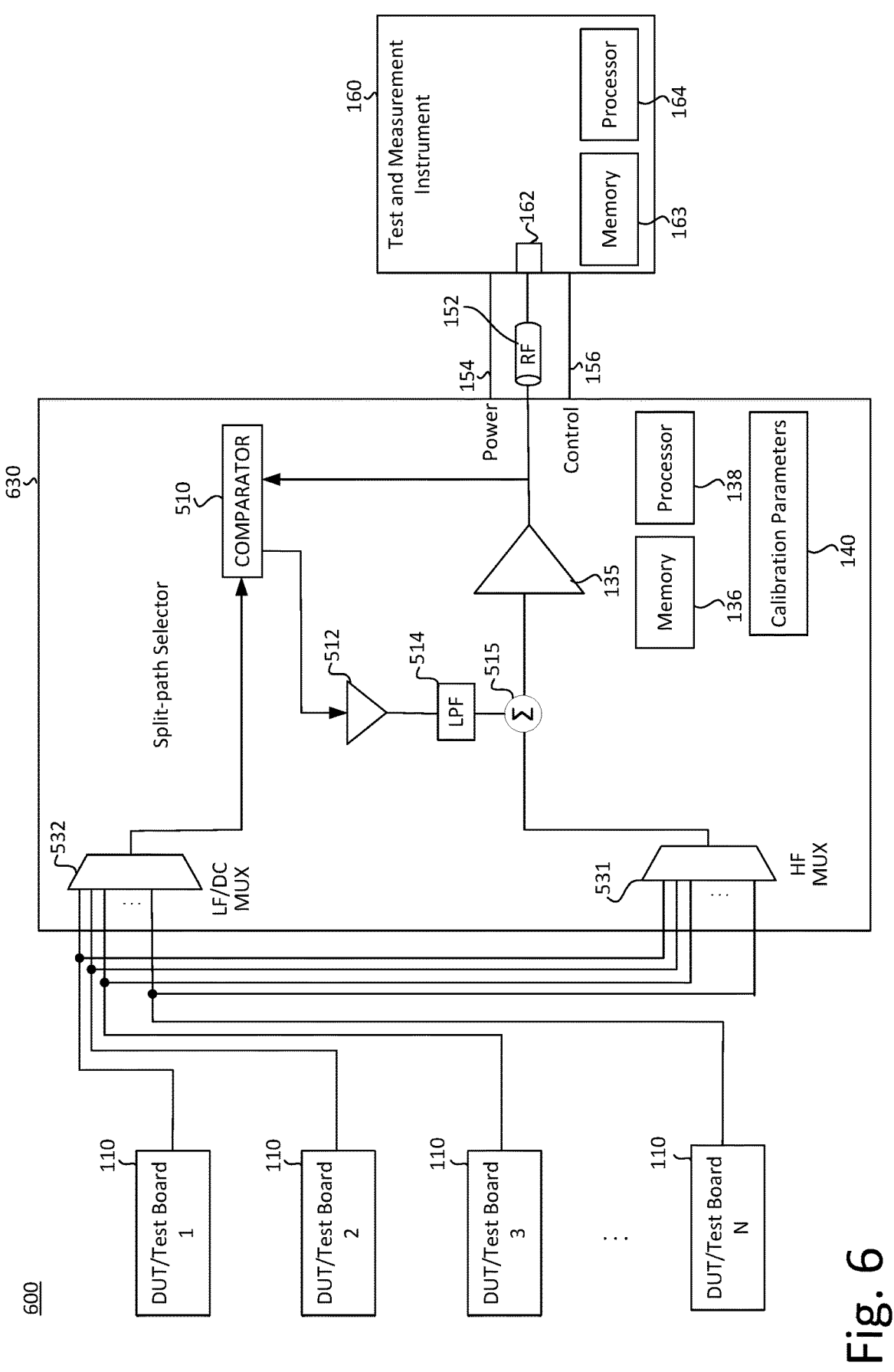
FIG. 6 is a block diagram of a test and measurement system including a split-path selector in which the lower frequencies or DC signals and the higher frequencies are independently selected, and further including a feed-back control system according to embodiments.

FIG. 6 illustrates a test and measurement system 600 including a split-path selector 630 that operates similarly to the split-path selector 530 of FIG. 5. In the split-path selector 630, however, the inputs of the comparator 510 are respectively coupled to the output of the LF/DC multiplexer 532 as well as an output of the amplifier 135. This architecture as illustrated in FIG. 6 creates a feedback loop, where the output of the amplifier 135 is compared to the output of the LF/DC multiplexer 532 to cause the combination of the amplifier 512 and low pass filter 514 to add back any portion of the low frequencies of the selected signal to the output of the HF multiplexer 532, thereby faithfully recreating the full bandwidth of signal from the selected DUT 110.

Compared to the embodiment of FIG. 1, the split-path selectors 530, 630 do not require any diplexers, either between the DUTs 110 and the multiplexers 531, 532, nor to combine the outputs of the multiplexers. The remainder of the systems 500, 600 operate the same or similar as the embodiments described above.

Aspects of the disclosure may operate on particularly created hardware, firmware, digital signal processors, or on a specially programmed computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a computer readable storage medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or computer-readable storage media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. A configuration of the technologies may include any one or more, and any combination of, the examples described below.

Example 1 is an input selector for electrically connecting one of a plurality of test signals from one or more devices under test to a test and measurement instrument, the input selector including a first multiplexer having a first set of multiple inputs, each of the first set of multiple inputs coupled to a different one of the plurality of test signals from one or more devices under test, and having a first output of a selected one of the first multiple inputs, and a second multiplexer having a second set of multiple inputs, each of the second set of multiple inputs coupled to a different one of the plurality of test signals from the one or more devices under test, and having a second output of a selected one of the multiple inputs.

Example 2 is an input selector according to Example 1, further comprising a diplexer having an input coupled to one of the one or more devices under test, having a low-frequency output coupled to one of the first set of multiple inputs, and having a high-frequency output coupled to one of the second set of multiple inputs.

Example 3 is an input selector according to Example 2, further comprising a second diplexer having a first input coupled to the first output of the first multiplexer, having a second input coupled to the second output of the second multiplexer, and having an output.

Example 4 is an input selector according to Example 3, further comprising an amplifier coupled to the output of the second diplexer amplifying the selected test signal of the device under test before being sent as an output of the input selector to the test and measurement instrument.

Example 5 is an input selector according to Example 4, in which the output of the input selector is sent over an RF cable to the test and measurement instrument.

Example 6 is an input selector according to any of the preceding Examples, in which the first multiplexer comprises a set of solid-state radio frequency switches, PIN-diode switches, or MEMS switches.

Example 7 is an input selector according to Example 6, in which the second multiplexer comprises a set of field effect transistor switches or MEMS switches.

Example 8 is an input selector according to any of the preceding Examples, further comprising a signal conditioner structured to modify a signal on the first output of the first multiplexer.

Example 9 is an input selector according to Example 8, in which the signal conditioner is structured to modify the signal on the first output of the first multiplexer by performing a function of amplifying, attenuating, delaying, or converting from analog to digital.

Example 10 is an input selector according to any of the preceding Examples, in which the first output of the first multiplexer and the second output of the second multiplexer are both output from the input selector.

Example 11 is an input selector according to any of the preceding Examples, further comprising a comparator coupled to the first output of the first multiplexer and coupled to the second output of the second multiplexer, and structured to generate a comparison signal between the first output and the second output.

Example 12 is an input selector according to Example 11, further including an amplifier to amplify an output of the comparator, and a summer to combine the amplified output of the comparator to an output of the second multiplexer.

Example 13 is a method for selecting a signal for measurement in a selector coupled to a plurality of input signals to choose from as the selected signal, the method including filtering the selected signal into two separate components, one having a low frequency and a second having a high frequency that is higher than the low frequency, routing the low frequency component through a first switch, and routing the high frequency component through a second switch.

Example 14 is a method according to Example 13, further comprising combining the low frequency component and the high frequency component after they have been respectively routed through the first and second switch.

Example 15 is a method according to Example 14, further comprising passing the combined components to a test and measurement device as a signal to be tested.

Example 16 is a method according to Example 14, further comprising modifying the low frequency component prior to the combination of the low frequency component and the high frequency component.

Example 17 is a method according to Example 16, in which the modification includes amplification, attenuation, or delaying.

Example 18 is a method according to any preceding Example method, in which filtering the selected signal into two separate components comprises passing the selected signal through a diplexer.

Example 19 is a method according to any preceding Example method, in which the first switch has different signal characteristics from the second switch.

Example 20 is a method according to any preceding Example method, further comprising passing the output of the first switch and the output of the second switch to a test and measurement device.

Example 21 is a method according to Example 20, further comprising converting the output of the first switch to a digital signal before passing the output of the first switch to the test and measurement device.

Example 22 is a method according to any preceding Example method, further comprising comparing the output of the first switch to the output of the second switch, and adding the output of the comparison to the output of the second switch.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that all features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Also, when reference is made in this application to a method having two or more defined steps or operations, the defined steps or operations can be carried out in any order or simultaneously, unless the context excludes those possibilities.

Although specific examples of the disclosure have been illustrated and described for purposes of illustration, it will be understood that various modifications may be made without departing from the spirit and scope of the disclosure. Accordingly, the disclosure should not be limited except as by the appended claims.

We claim:

1. An input selector for electrically connecting one of a plurality of test signals from one or more devices under test to a test and measurement instrument, the input selector comprising:

a first multiplexer having a first set of multiple inputs, each of the first set of multiple inputs coupled to a different one of the plurality of test signals from the one or more devices under test, and having a first output of a selected one of the first set of multiple inputs;

a second multiplexer having a second set of multiple inputs, each of the second set of multiple inputs coupled to a different one of the plurality of test signals from the one or more devices under test, and having a second output of a selected one of the second set of multiple inputs; and a diplexer having an input coupled to one of the test signals from the one or more devices under test, having a low-frequency output coupled to one of the first set of multiple inputs, and having a high-frequency output coupled to one of the second set of multiple inputs, the diplexer structured to filter the input test signal into low-frequency components and high-frequency components, route the low-frequency components to the first multiplexer, and route the high-frequency components to the second multiplexer.

2. The input selector of claim 1, further comprising a second diplexer having a first input coupled to the first output of the first multiplexer, having a second input coupled to the second output of the second multiplexer, and having an output.

3. The input selector of claim 2, further comprising an amplifier coupled to the output of the second diplexer amplifying the selected test signal of the device under test before being sent as an output of the input selector to the test and measurement instrument.

4. The input selector of claim 3, in which the output of the input selector is sent over an RF cable to the test and measurement instrument.

5. The input selector of claim 1, in which the first multiplexer comprises a set of solid-state radio frequency switches, PIN-diode switches, or MEMS switches.

6. The input selector of claim 5, in which the second multiplexer comprises a set of field effect transistor switches or MEMS switches.

7. The input selector of claim 1, further comprising a signal conditioner structured to modify a signal on the first output of the first multiplexer.

8. The input selector of claim 7, in which the signal conditioner is structured to modify the signal on the first output of the first multiplexer by performing a function of amplifying, attenuating, delaying, or converting from analog to digital.

9. The input selector of claim 1, in which the first output of the first multiplexer and the second output of the second multiplexer are both output from the input selector.

10. An input selector for electrically connecting one of a plurality of test signals from one or more devices under test to a test and measurement instrument, the input selector comprising:

a first multiplexer having a first set of multiple inputs, each of the first set of multiple inputs coupled to a different one of the plurality of test signals from the one or more devices under test, and having a first output of a selected one of the first set of multiple inputs;

a second multiplexer having a second set of multiple inputs, each of the second set of multiple inputs coupled to a different one of the plurality of test signals from the one or more devices under test, and having a second output of a selected one of the second set of multiple inputs; and a comparator coupled to the first output of the first multiplexer and coupled to the second output of the second multiplexer, and structured to generate a comparison signal between the first output and the second output.

11. The input selector of claim 10, further comprising:

an amplifier to amplify an output of the comparator; and a summer to combine the amplified output of the comparator to an output of the second multiplexer.

12. The input selector of claim 10, in which the first multiplexer is a low-frequency multiplexer, and the second multiplexer is a high-frequency multiplexer.

13. A method for selecting a signal for measurement in a selector coupled to a plurality of input signals to choose from as the selected signal, the method comprising:

filtering the selected signal into two separate components, one having a low frequency and a second having a high frequency that is higher than the low frequency;

routing the low frequency component through a first switch; and routing the high frequency component through a second switch.

14. The method of claim 13, further comprising combining the low frequency component and the high frequency component after they have been respectively routed through the first and second switch.

15. The method of claim 14, further comprising passing the combined components to a test and measurement device as a signal to be tested.

16. The method of claim 14, further comprising modifying the low frequency component prior to the combination of the low frequency component and the high frequency component.

17. The method of claim 16, in which the modification includes amplification, attenuation, or delaying.

18. The method of claim 13, in which filtering the selected signal into two separate components comprises passing the selected signal through a diplexer.

19. The method of claim 13, in which the first switch has different signal characteristics from the second switch.

20. The method of claim 13, further comprising passing the output of the first switch and the output of the second switch to a test and measurement device.

21. The method of claim 20, further comprising converting the output of the first switch to a digital signal before passing the output of the first switch to the test and measurement device.

22. The method of claim 13, further comprising:

comparing the output of the first switch to the output of the second switch; and adding the output of the comparison to the output of the second switch.

* * * * *